(12) United States Patent
Parker et al.

(10) Patent No.: US 6,706,639 B2
(45) Date of Patent: Mar. 16, 2004

(54) METHOD FOR INTERCONNECTING MAGNETORESISTIVE MEMORY BITS

(75) Inventors: Randall Scott Parker, Eau Claire, WI (US); John Jeffery Wagner, Eleva, WI (US); Hans Peter Mikelson, Eau Claire, WI (US)

(73) Assignee: Union Semiconductor Technology Corp., Plymouth, MN (US)

( * ) Notice: Subject to any disclaimer, the term of this patent is extended or adjusted under 35 U.S.C. 154(b) by 93 days.

(21) Appl. No.: 10/034,483

(22) Filed: Dec. 28, 2001

(65) Prior Publication Data

US 2003/0124854 A1 Jul. 3, 2003

(51) Int. Cl.[7] .............................................. H01L 21/302
(52) U.S. Cl. ....................... 438/706; 438/692; 438/710; 438/712; 438/720
(58) Field of Search ................................. 438/691, 692, 438/706, 710, 712, 720

(56) References Cited

U.S. PATENT DOCUMENTS

| | | | | |
|---|---|---|---|---|
| 5,496,759 A | * | 3/1996 | Yue et al. ...................... | 438/3 |
| 5,593,919 A | * | 1/1997 | Lee et al. ..................... | 438/626 |
| 5,861,328 A | * | 1/1999 | Tehrani et al. ................ | 438/3 |
| 5,904,569 A | | 5/1999 | Kitch | |
| 6,048,739 A | * | 4/2000 | Hurst et al. ................... | 438/3 |
| 6,103,629 A | * | 8/2000 | Kitch et al. .................. | 438/692 |
| 6,133,635 A | * | 10/2000 | Bothra et al. ................ | 438/671 |
| 6,153,443 A | * | 11/2000 | Durlam et al. ................ | 438/3 |
| 6,165,803 A | * | 12/2000 | Chen et al. .................... | 438/3 |
| 6,174,737 B1 | * | 1/2001 | Durlam et al. ................ | 438/3 |
| 6,261,893 B1 | * | 7/2001 | Chang et al. ................. | 438/3 |
| 6,315,875 B1 | | 11/2001 | Sasaki | |
| 6,440,753 B1 | * | 8/2002 | Ning et al. .................... | 438/3 |
| 6,486,065 B2 | * | 11/2002 | Vyvoda et al. ............... | 438/690 |

* cited by examiner

Primary Examiner—Nadine G. Norton
Assistant Examiner—Lan Vinh
(74) Attorney, Agent, or Firm—Alan Kamrath; Rider Bennett, LLP

(57) ABSTRACT

A process forms electrical interconnects between memory bits in a magnetoresistive memory device. An initial dielectric layer is formed to overlie a semiconductor substrate. A magnetoresistive storage layer is formed over the initial dielectric layer. An electrically conductive stop layer that is selective to etch processes and is mechanically hard is deposited over the magnetoresistive storage layer. A hardmask layer is formed to overlie the stop layer. The hardmask layer is etched to expose the stop layer. The stop layer and the magnetoresistive storage layer are etched using ion milling until the initial dielectric layer is exposed, defining individual magnetoresistive memory bits. An isolation layer is formed over the hardmask layer and in the etch regions between magnetoresistive bits. The isolation layer is planarized using chemical mechanical polish (CMP) until the stop layer is exposed. An interconnect layer is then formed over the exposed regions of the stop layer and is etched to form electrical interconnects between memory bits.

58 Claims, 5 Drawing Sheets

METHOD FOR INTERCONNECTING MAGNETORESISTIVE MEMORY BITS

BACKGROUND OF THE INVENTION

Integrated circuits commonly use multilevel interconnections as a means for electrically interconnecting semiconductor devices which include active or passive circuit elements. High-density integrated circuits such as Dynamnic Random Access Memories (DRAMs) or Static Random Access Memories (SRAMs) are typically comprised of hundreds of thousands or millions of semiconductor devices on a silicon substrate. These high density integrated circuits can be manufactured using a Complementary Metal-Oxide Semiconductor (CMOS) process and typically involve the use of multiple layers of vertically stacked metal interconnects. Fabrication of CMOS integrated circuits typically involves many manufacturing steps which include repeated deposition or growth, patterning, and etching of thin films of semiconductor, polysilicon, metal, and dielectric materials to form the electrical circuitry which typically consists of n-channel and p-channel transistors and active and passive circuit elements. Typically, the steps to form the n-channel and p-channel transistors are completed before the interconnect metal is formed. While active and passive circuit elements may be fabricated at any time during the processing sequence depending on the particular type of element, active circuit elements such as magnetoresistive memory storage bits are typically fabricated at the third metal level after the n-charnel and p-channel transistors are formed.

Forming metal interconnect typically requires the repeated steps of deposition or growth, patterning and etching of metal, via and dielectric layers as necessary to connect the integrated circuit elements. Typically, after the n-channel and p-channel transistors have been patterned and etched, a dielectric layer (e.g., silicon oxide) is formed over the surface of the topography to provide dielectric isolation between the devices and the overlying interconnect conducting regions. Next, a contact layer is patterned into the dielectric layer to define openings in the dielectric layer where ohmic contacts will interconnect a first level of metal to the source, drain and gate regions of the n-channel and p-channel transistors. The contact layer patterning is accomplished by first depositing a photoresist layer over the dielectric layer. The photoresist is next selectively exposed to light through a patterned reticle having the desired layer pattern. After exposure, the photoresist is developed to form a resist mask for the desired layer pattern. The exposed layer is then etched to define the contact openings. The last step is to deposit and etch the contact metal.

Following the above process, the first level of metal is deposited, patterned and etched over the contact and dielectric layers. The first level of metal is positioned over the contacts to provide electrical interconnection between the first level of metal and the n-channel and p-channel devices. A second dielectric layer is next formed over the patterned first metal layer. After via holes are formed in the second dielectric layer to provide openings to the first metal layer, a conductive material, such as tungsten, is deposited to fill the via holes and form "tungsten plugs." After the tungsten plugs are formed, a second metal layer is deposited, patterned and etched over the tungsten plugs and the first dielectric layer. The second layer of metal is positioned over and in physical contact with the tungsten plugs to provide electrical interconnection between the second layer of metal and the first layer of metal. The steps of deposition or growth, patterning, and etching of metal, via and dielectric layers is repeated as desired to provide the necessary interconnect to form the integrated circuit.

Magnetoresistive memory storage bits are typically fabricated at the third metal level stage because the ferromagnetic materials used to form the magnetoresistive memory storage bits require processing below 300 degrees C. The bits are developed through repeated deposition of multiple thin films which may include cobalt, copper, nickel, iron, or tantalum. Once the magnetoresistive bits are formed, the bits are typically interconnected as a series of "bit strings", where each bit string may consist of 4, 8, or 16 bits. Each bit string is then interconnected through metal interconnect layers to the electrical circuits.

As successive metal interconnect layers are fabricated to interconnect magnetoresistive bits, smooth planar surfaces become increasingly difficult to maintain. The resulting uneven topographies create a variety of problems, all of which reduce integrated circuit functional yields and reliability. One problem that results is that photoresist material cannot be applied in a uniform fashion over uneven topographies. Thus, when the stops of patterning the photoresist to form a resist mask and etching the exposed layer occur, features of the exposed layer may not be completely etched due to the incomplete development of the photoresist.

Another problem that results is poor step coverage. Step coverage is defined as a measure of how well a metal or dielectric film conforms over a previous step and is represented by the ratio of the minimum thickness of a film as it crosses a step to the nominal thickness of the film over relatively flat horizontal regions. If the step coverage is too small in metal films, high current densities can result which can cause electromigration or high current-induced stress failure. Small step coverages also increase metal interconnect layer resistance which can decrease integrated circuit performance or result in total failure.

Still another problem that can occur after etching the dielectric layer to form the via holes is polymer residue damage to the via holes. After the via holes are etched, polymer residues which occur during the etching process can remain in the via hole resulting in poor contact resistance between the via fill metal and metal interconnect layer.

Yet another problem that can occur is oxidation of the via fill or metal interconnect layer material surfaces. After the via holes are etched and the tungsten fill metal is conformally deposited over the surface of the via-level dielectric layer, the tungsten is etched back or chemical mechanically polished back to the surface of the dielectric layer thus exposing the surface of the vias to oxidation.

Still yet another problem that can occur from the steps of patterning dielectric, via and metal layers is damage to underlying metal layers and film layers such as magnetoresistive thin film storage layers. To prevent this damage, an additional electrically conductive layer called a stop layer that is both chemically inert and physically hard must be formed to overlie the metal or film layers.

It is therefore an object of the present invention to provide a method for forming metal to metal interconnects which have high-current carrying capability and which are electromigration resistant.

It is another object of the present invention to provide a method for forming interlevel metal to metal interconnects which reduce the number of processing steps required by eliminating one or more levels of via photolithography and etch processing steps.

It is yet another object of the present invention to provide a method for forming interlevel metal to metal interconnects that provide smooth planar topographies and improved step coverage resulting in improved reliability and yield.

It is still yet another object of the present invention to provide a stop layer which prevents damage to underlying metal interconnect layers or magnetoresistive thin film storage layers by being both chemically inert and physically hard resulting in improved reliability and yield.

SUMMARY OF THE INVENTION

The present invention overcomes many of the disadvantages of the prior art by providing a method for manufacturing a high current, electromigration resistant interconnect for a magnetoresistive memory. Additional features and advantages of the invention will be set forth in the description that follows, and will be apparent from the description or will be learned through practice of the invention.

Although the preferred embodiment is used to interconnect magnetoresistive elements, the method may also be used to connect other circuit elements.

In a preferred embodiment of the present invention, an initial dielectric layer is formed to overlie a semiconductor substrate. Next, the initial dielectric layer is planarized using a chemical mechanical polish. A magnetoresistive storage layer is then formed to overlie the initial dielectric layer. The magnetoresistive storage layer may be comprised of a variety of magnetic materials including materials used to form Anisotropic Magnetoresistance (AMR) devices, Giant Magnetoresistance (GMR) devices, Colossal Magnetoresistance (CMR) devices, Tunneling Magnetoresistance (TMR) devices, Extraordinary Magnetoresistance (EMR) devices or Very Large Magnetoresistance (VLMR) devices. In a preferred embodiment, the magnetoresistive storage layer is formed of materials which form "pseudo" spin valve structures. Next, an initial stop layer is formed to overlie the magnetoresistive storage layer. A final stop layer is then formed to overlie the initial stop layer. A hardmask layer is next formed to overlie the final stop layer. The hardmask layer and the final stop layer are etched until the initial stop layer is exposed to define an etch region. Using the etch region as an etch opening, the initial stop layer and the magnetoresistive storage layer are etched using blanket ion milling until the initial dielectric layer is exposed to define two or more magnetoresistive memory storage bits. An isolation layer having sufficient thickness to fill in the gaps created by etching the etch region is formed over the hardmask layer and in the etch region. The isolation layer is planarized using a chemical mechanical polish until regions of the final stop layer are exposed. The interconnect layer is then formed over the exposed regions of the final stop layer and is patterned and etched to electrically interconnect at least two magnetoresistive memory storage bits.

BRIEF DESCRIPTION OF THE DRAWINGS other objects of the present invention and many of the attendant advantages of the present invention will be readily appreciated as the same becomes better understood by reference to the following detailed description when considered in connection with the accompanying drawings, in which like reference numerals designate like parts throughout the figures thereof, and wherein.

DETAILED DESCRIPTION OF THE PREFERRED EMBODIMENTS

Figure 1:
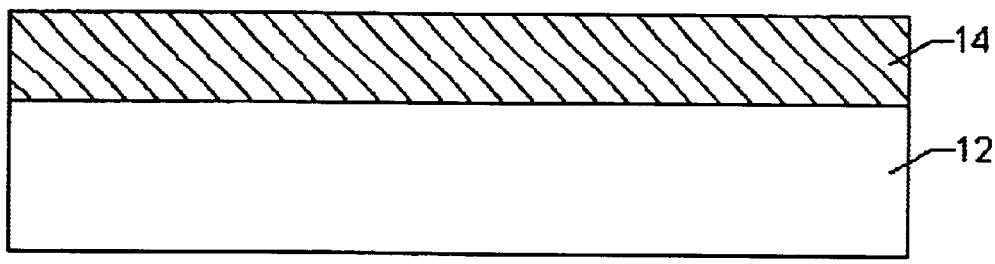
FIGS. 1–8 are cross-sectional views which illustrate sequentially the magnetoresistive memory interconnect fabrication method according to the present invention.

Referring now to the drawings, FIGS. 1–8 are cross-sectional views that illustrate sequentially the magnetoresistive memory interconnect fabrication method.

FIG. 1 is cross-sectional view showing an initial dielectric layer 14 deposited to overlie a semiconductor substrate 12. It is possible for many types of materials or structures to be formed on substrate 12 prior to forming initial dielectric layer 14, including contact, via or interconnect metallization layers, CMOS integrated circuits, or active or passive circuit elements. Fabrication of CMOS integrated circuits typically involves the repeated deposition or growth, patterning, and etching of semiconductor, polysilicon, metal, or dielectric materials to form electrical circuitry which may include n-channel and p-channel transistors. These transistors, along with the contact, via or interconnect metallization layers, may form complex circuit functions which are required to operate a magnetoresistive memory and further may include such functions as read and write control. The exact composition of the materials or structures formed on substrate 12 does not directly affect the practice of the present invention.

Initial dielectric layer 14 is a dielectric material such as silicon nitride which is deposited on the surface of substrate 12. Dielectric layer 14 is planarized using a chemical mechanical polish to a degree of flatness which is sufficient for a magnetoresistive layer 16. Once planarized, dielectric layer 14 provides the uniform surface required by the very thin films used to form magnetoresistive layer 16.

Figure 2:
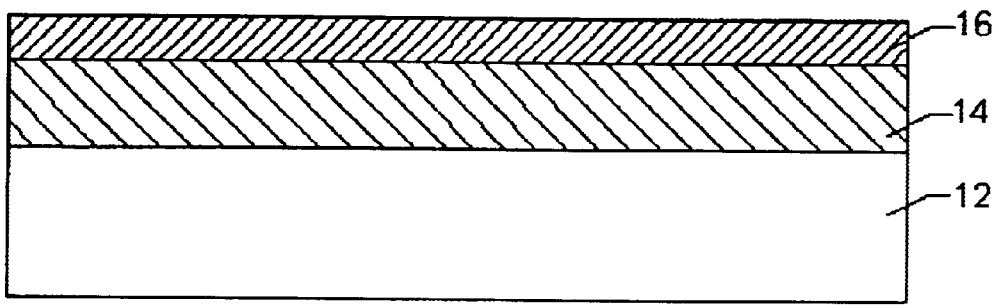

FIG. 2 is a cross-sectional view showing magnetoresistive layer 16 formed over the planarized surface of dielectric layer 14. The exact composition of magnetoresistive layer 16 does not directly affect the practice of the present invention, but may include any materials having the property wherein a change in resistance of the material is observed when an external magnetic field is applied. In exemplary embodiments, these materials may include AMR materials, GMR materials, CMR materials, TMR materials, EMR materials, and VLMR materials.

Figure 3:
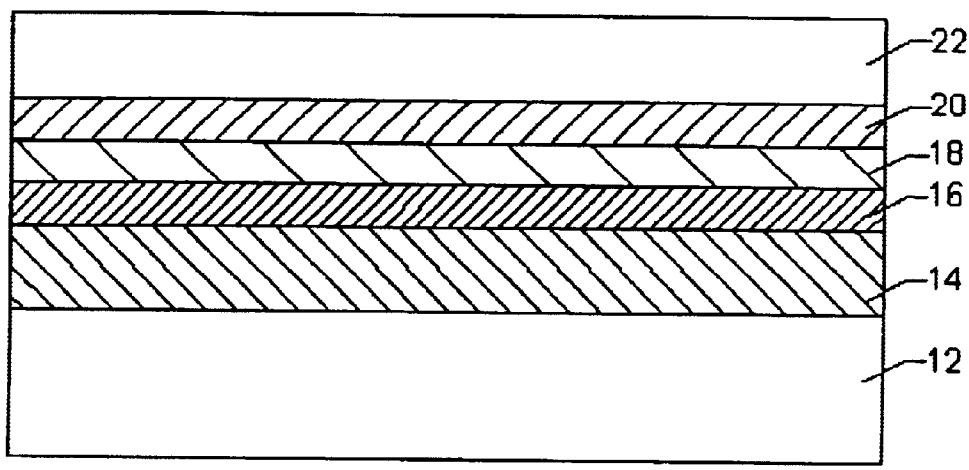

FIG. 3 is a cross-sectional view showing an initial stop layer 18, a final stop layer 20 and a hardmask layer 22 formed over the magnetoresistive layer 16. The exact composition of initial stop layer 18 does not directly affect the practice of the present invention, except that it must be electrically conductive. Initial stop layer 18 may include any materials having an etch selectivity which is greater than the etch selectivity of the hardmask layer 22 and final stop layer 20. In exemplary embodiments, these materials may include chromium and silicon.

Final stop layer 20 is deposited to overlie initial stop layer 18. The exact composition of final stop layer 20 does not directly affect the practice of the present invention, but may include any materials that are electrically conductive, inert to chemicals contained in polishing slurries, and having a chemical mechanical polish selectivity which is greater than the chemical mechanical polish selectivity of the hardmask layer 20. In exemplary embodiments, these materials may include titanium and tungsten.

Hardmask layer 22 is deposited to overlie final stop layer 20. The exact composition of hardmask layer 22 does not directly affect the practice of the present invention. In exemplary embodiments, this material may be silicon dioxide.

Figure 4:
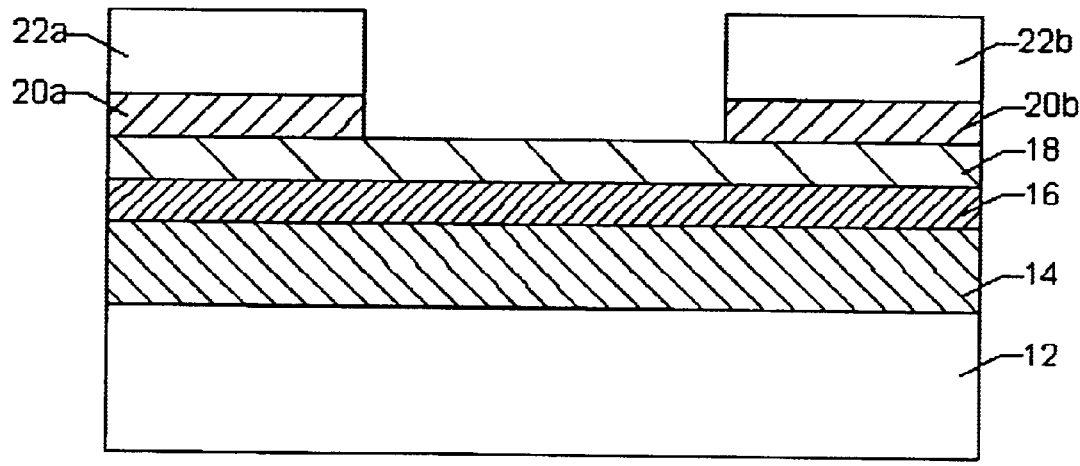

FIG. 4 is a cross-sectional view showing hardmask layer 22 and final stop layer 20 having been etched until the initial stop layer 18 is exposed to define an etch region. The etch region is shown as the space between hardmask layers 22a and 22b and the space between final stop layers 20a and 20b.

Figure 5:
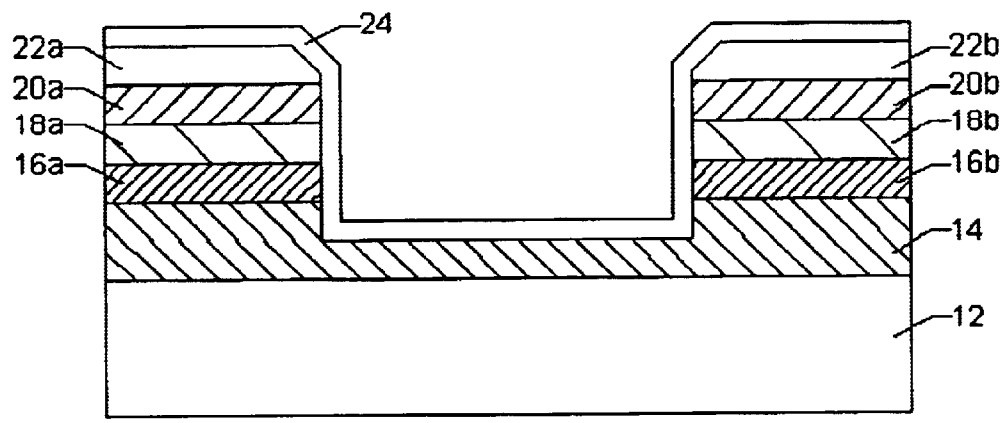

FIG. 5 is a cross-sectional view showing initial stop layer 18 and magnetoresistive layer 16 having been etched through using blanket ion milling to expose the initial dielectric layer. The etch region is shown as the space between initial stop layer 18a and 18b and magnetoresistive layer 16a and 16b.

An initial isolation or dielectric layer 24 is deposited to overlie the hardmask layer 22 and the plurality of etch regions defined by blanket ion milling.

Figure 6:
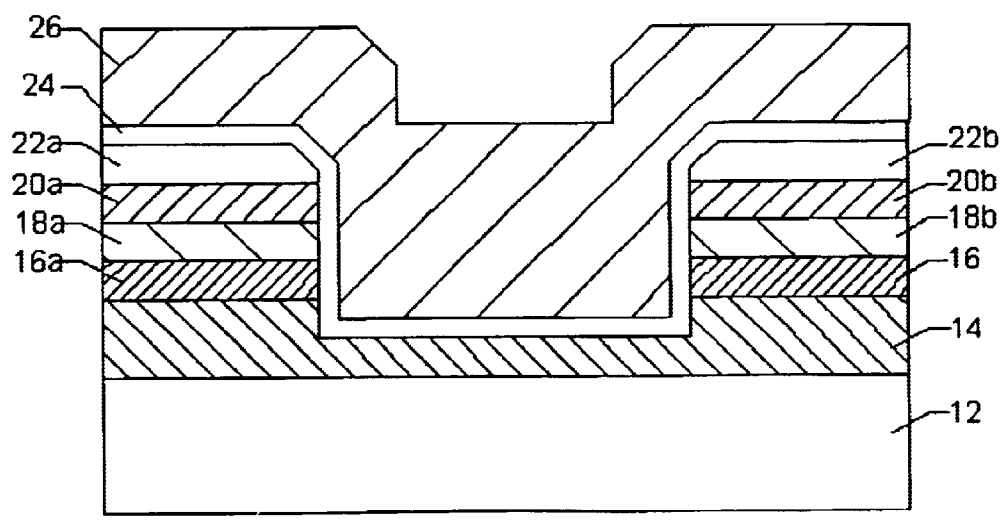

FIG. 6 is a cross-sectional view showing a final isolation layer 26 deposited to overlie initial isolation layer 24. The thickness of final isolation layer 26 must be great enough to fill any gaps created by etching the etch region.

Figure 7:
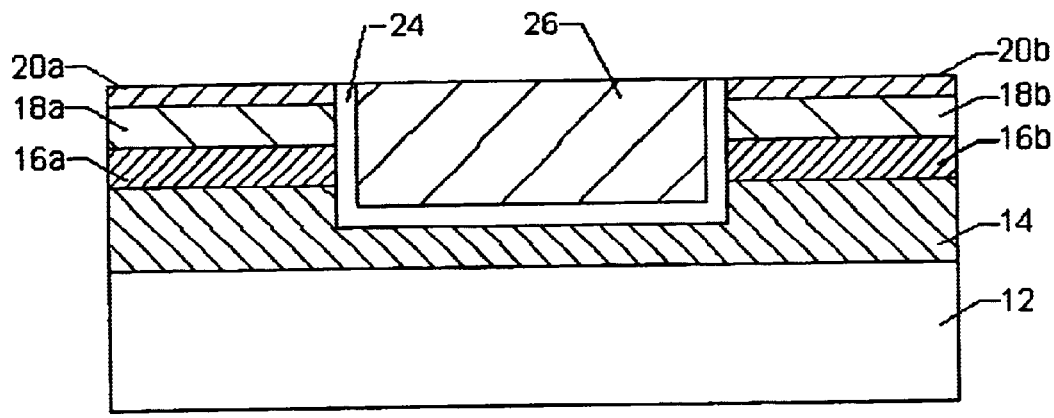

FIG. 7 is a cross-sectional view showing the structure after chemical mechanical polishing. Isolation layers 26 and 24 and hardmask layer 22 have been polished to expose final stop layers 20a and 20b. Isolation layers 26 and 24 films remain in the etch region. The chemical mechanical polishing has been stopped by final stop layers 20a and 20b.

Figure 8:
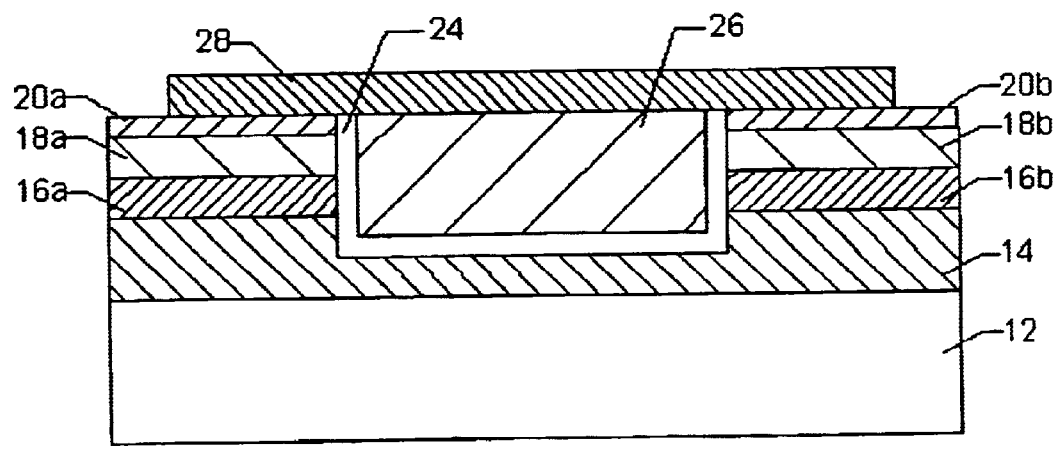

FIG. 8 is a cross-sectional view showing the structure after an interconnect layer 28 has been deposited to overlie final stop layers 20a and 20b, initial isolation layer 24 and final isolation layer 26. Interconnect layer 28 has been etched to form a plurality of interconnect regions which connect each of the plurality of magnetoresistive elements to each other. The actual composition of the interconnect layer does not directly affect the practice of the present invention, but may include any materials which provide a conductive interconnect between the magnetoresistive elements.

The chemical mechanical polishing process, as illustrated in FIG. 7, eliminates the need for formation of vias by creating an opening in the interlayer dielectric that allows for contact between initial and final metal layers. In so doing, the process described provides solutions to the problems associated with the formation of metal to metal interconnect vias that were described above.

Specifically, since the process is performed by polishing, large topographies from previously patterned layers are planarized, thereby allowing interconnect layer 28 to be deposited over a planar surface. This reduces the step height of the interconnect to zero, thus insuring 100% step coverage of interconnect layer 28 over final stop layers 20a and 20b. With full step coverage, the metal to metal interconnect that is formed will have high-current carrying capability and be electromigration resistant.

Yet another advantage realized by forming metal to metal interconnects using a polishing process is a reduction in the number of processing steps that result from eliminating one or more levels of via photolithography and etch processing steps. By eliminating these steps, processing issues associated with the formation of vias, such as polymer residue damage in the via holes and damage to underlying magnetoresistive thin film storage layers, can be avoided.

Figure 9:
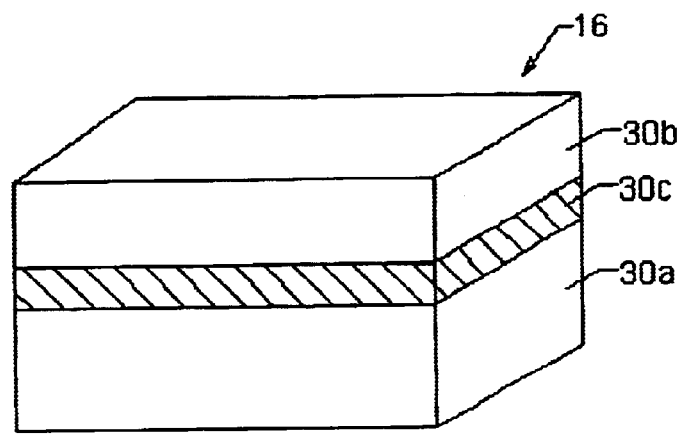
FIG. 9 is a cross-section diagram illustrating a single magnetoresistive memory storage bit.

FIG. 9 is a cross-sectional diagram showing one of a plurality of embodiments of a magnetoresistive storage bit. FIG. 9 illustrates the generalized components of magnetoresistance layer 16, which is composed of dual magnetic layers 30a and 30b and a coupling layer 30c.

Figure 10:
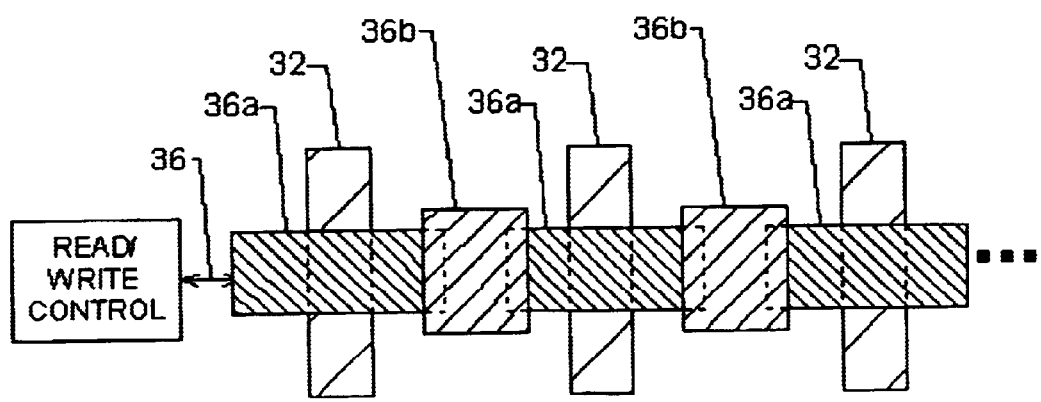
FIG. 10 is a diagram illustrating the read and write control circuitry coupled to an array of magnetoresistive memory storage bits.

FIG. 10 illustrates the read and write control circuitry coupled to an array of magnetoresistive memory storage bits 36a. The plurality of magnetoresistive storage bits 36a are connected by a plurality of interconnects 36b to form a bit string 36. The address of the memory location is determined by selection of both a word line 32 and bit string 36.

The present invention maybe embodied in other specific forms without departing from the spirit or essential attributes thereof. It is therefore desired that the present embodiment be considered in all respects as illustrative and not restrictive, reference being made to the appended claims rather than to the foregoing description to indicate the scope of the invention.

What is claimed:

1. A method of manufacturing an interconnect for a magnetoresistive memory on a semiconductor substrate comprising:
   (a) foaming an initial dielectric overlying the semiconductor substrate;
   (b) planarizing the initial layer;
   (c) forming a magnetoresistive storage layer overlying the initial dielectric layer;
   (d) forming an electrically-conductive initial stop layer overlying the magnetoresistive storage layer;
   (e) forming an electrically-conductive final stop layer overlying the initial stop layer;
   (f) forming a hardmask layer overlying the final stop layer;
   (g) etching the hardmask layer and the final stop layer until the initial stop layer is exposed to define an etch region;
   (h) etching through the initial stop layer and the magnetoresistive storage layer until the initial dielectric layer is exposed using the etch region as an etch opening;
   (i) forming an isolation layer extending over the hardmask layer and into the etch region, the isolation layer having sufficient thickness to fill in the gaps created by etching the etch region;
   (j) planarizing the isolation layer until regions of the final stop layer are exposed; and
   (k) forming an interconnect layer over the exposed regions of the final stop layer.

2. The method of claim 1 wherein forming the initial dielectric layer comprises foaming a layer of silicon nitride.

3. The method of claim 1 wherein planarizing the initial dielectric layer is completed using a chemical mechanical polish.

4. The method of claim 1 wherein forming the magnetoresistive storage layer comprises forming a plurality of layers selected from the group consisting of cobalt, copper, nickel, iron, tantalum, and combinations thereof.

5. The method of claim 1 wherein forming the initial stop layer comprises forming a layer consisting of chromium and silicon.

6. The method of claim 1 wherein forming the final stop layer comprises forming a layer which has a chemical mechanical polish stop selectivity which is greater than the handmark layer.

7. The method of claim 1 wherein forming the final stop layer comprising a layer consisting of titanium and tungsten.

8. The method of claim 1 wherein forming the hardmask layer comprises forming a layer consisting of silicon dioxide.

9. The method of claim 1 wherein etching through the initial stop layer and the magnetoresistive storage layer is completed using blanket ion milling.

10. The method of claim 1 wherein etching the hardmask layer and the final stop layer until the initial stop layer is exposed is completed using a dry etch.

11. The method of claim 1 wherein forming the isolation layer comprises:
   forming an barrier layer extending over the hardmask layer and into the etch region to conformally overlie the hardmask layer and the exposed portions of the final stop layer, the initial stop layer, the magnestoresistive storage layer and the initial dielectric layer in the etch region; and
   forming a final dielectric layer over the barrier layer wherein the final dielectric layer has sufficient thickness to fill in the gaps created by etching the etch region.

12. The method of claim 1 wherein foaming the barrier layer comprises foaming a layer consisting of silicon nitride.

13. The method of claim 1 wherein planarizing the isolation layer is completed using a chemical mechanical polish.

14. The method of claim 1 wherein foaming the interconnect layer comprises forming a layer consisting of titanium and tungsten.

15. The method of claim 1 wherein forming the initial stop layer comprises forming a layer having an etch selectivity which is greater than the etch selectivity of the hardmask layer.

16. The method of claim 15 wherein forming the initial stop layer comprises forming a layer having an etch selectivity which is 25 times greater than the etch selectivity of the hardmask layer.

17. A method of manufacturing an interconnect for a magnetoresistive memory array comprising:
   (a) providing a semiconductor substrate;
   (b) foaming an initial dielectric layer overlying the semiconductor substrate;
   (c) planarizing the initial dielectric layer;
   (d) forming a magnetoresistive storage layer overlying the initial dielectric layer;
   (e) forming an electrically-conductive initial stop layer overlying the magnestoresistive storage layer;
   (f) forming an electrically-conductive final stop layer overlying the initial stop layer;
   (g) foaming a hardmask layer overlying the final stop layer;
   (h) etching portions of the hardmask layer and the final stop layer until the initial stop layer is exposed to define a plurality of etch regions;
   (i) forming a plurality of magnetoresistive memory storage bits by etching through the initial stop layer and the magnetoresistive storage layer until the initial dielectric layer is exposed using the plurality of etch regions as etch openings;
   (j) forming an isolation layer extending over the hardmask layer and into the plurality of etch regions, the isolation layer having sufficient thickness to fill in the gaps created by etching the plurality of etch regions;
   (k) planarizing the isolation layer until a plurality of regions of the final stop layer are exposed; and
   (l) forming a plurality of interconnects over portions of the plurality of regions of the final stop layer to interconnect each one of the plurality of magnetoresistive memory storage bits to another one of the plurality of magnetoresistive memory storage bits.

18. The method of claim 17 wherein forming the initial dielectric layer comprises foaming a layer of silicon nitride.

19. The method of claim 17 wherein planarizing the initial dielectric layer is completed using a chemical mechanical polish.

20. The method of claim 17 wherein forming the magnestoresistive storage layer comprises forming a plurality of layers selected from the group consisting of cobalt, copper, nickel, iron, tantalum, and combination, thereof.

21. The method of claim 17 wherein forming the initial stop layer comprises forming a layer consisting of chromium and silicon.

22. The method of claim 17 wherein forming the final stop layer comprises forming a layer which has a chemical mechanical polish stop selectivity which is greater than the hardmask layer.

23. The method of claim 17 wherein forming the final stop layer comprises a layer consisting of titanium and tungstan.

24. The method of claim 17 wherein forming the hardmask layer comprises forming a layer consisting of silicon dioxide.

25. The method f claim 17 wherein patterning a plurality of magnetoresistive memory storage bits by etching through the initial stop layer and the magnetoresistive storage layer is completed using blanket ion milling.

26. The method of claim 17 wherein etching the hardmask layer and the final stop layer until the initial stop layer is exposed is completed using a dry etch.

27. The method of claim 17 wherein forming the isolation layer comprises:
   forming a barrier layer extending over the hardmask layer and into the plurality of etch regions to conformally overlie the hardmask layer and the exposed portions of the final stop layer, the initial stop layer, the magnetoresistive storage layer and the initial dielectric layer in the plurality of etch regions; and
   forming a final dielectric layer over the barrier layer wherein the final dielectric layer has sufficient thickness to fill in the gaps created by etching the plurality of etch regions.

28. The method of claim 27 wherein forming the barrier layer comprises forming a layer consisting of silicon nitride.

29. The method of claim 17 wherein planarizing the isolation layer is completed using a chemical mechanical polish.

30. The method of claim 17 wherein providing a semiconductor substrate further comprises forming an initial layer of metal overlying the semiconductor substrate, the initial dielectric layer overlying the initial layer of metal.

31. The method of claim 17 wherein forming the initial stop layer comprises forming a layer having an etch selectivity which is greater than the etch selectivity of the hardmask layer.

32. The method of claim 31 wherein forming the initial stop layer comprises forming a layer having an etch selectivity which is 25 times greater than the etch selectivity of the hardmask layer.

33. The method of claim 17 wherein forming a plurality of interconnects over portions of the plurality of regions of the final stop layer comprises:
   depositing a layer of interconnect metal which overlies the plurality of regions of the final stop layer; and
   selectively etching the layer of interconnect metal to interconnect each one of the plurality of magnetoresistive storage bits to another one of the plurality of magnetoresistive memory storage bits.

34. The method of claim 33 wherein depositing a layer of interconnect metal comprises deposing a layer consisting of titanium and tungsten.

35. A method of manufacturing an interconnect for a magnetoresistive memory storage device having a plurality of memory storage bits and read and write control circuitry for reading data from and writing data to the plurality of magnetoresistive memory storage bits, comprising:

(a) providing a semiconductor substrate;
(b) forming the read and write control circuitry on the semiconductor substrate;
(c) forming an initial dielectric overlying the read and write control circuitry;
(d) planarizing the initial dielectric layer;
(e) forming a magnetoresistive storage layer overlying the initial dielectric layer;
(f) forming an electrically-conductive initial stop layer overlying the magnetoresistive storage layer;
(g) forming an electrically-conductive final stop layer overlying the initial stop layer;
(h) foaming a hardmask layer overlying the final stop layer;
(i) etching portions of the hardmask layer and the final stop layer until the initial stop layer is exposed to define plurality of etch regions;
(j) forming the plurality of magnetoresistive memory storage bits by etching through the initial stop layer and the magnetoresistive storage layer until the initial dielectric layer is exposed using the plurality of etch regions as etch openings;
(k) forming an isolation layer extending over the hardmask layer and into the plurality of etch regions, the isolation layer having sufficient thickness to fill in the gaps created by etching the plurality of etch regions;
(l) Planarizing the isolation layer until a plurality of regions of the final stop layer are exposed; and
(m) forming a plurality of interconnects over portions of the plurality of regions of the final stop layer to interconnect each one of the plurality of magnetoresistive memory storage bits to another one of the plurality of magnetoresistive memory storage bits.

36. The method of claim 35 wherein forming the initial dielectric layer comprises forming a layer of silicon nitride.

37. The method of claim 35 wherein planarizing the initial dielectric layer is completed using a chemical mechanical polish.

38. The method of claim 35 wherein forming the magnetoresistive storage layer comprises forming a plurality of layer selected from the group consisting of cobalt, copper, nickel, iron, tantalum, and combinations thereof.

39. The method of claim 35 wherein forming the initial stop layer comprises forming a layer consisting of chromium and silicon.

40. The method of claim 35 wherein forming the final stop layer comprises forming a layer which mechanical polish stop selectivity which is greater than the hardmask layer.

41. The method of claim 35 wherein forming the final stop layer comprises forming a layer consisting of titanium and tungsten.

42. The method of claim 35 wherein forming the hardmask layer comprises forming a layer consisting of silicon dioxide.

43. The method of claim 35 wherein patterning a plurality of magnetoresistive memory storage bits by etching through the initial stop layer and the magnetoresistive storage layer is completed using blanket ion milling.

44. The method of claim 35 wherein etching the hardmask layer and the final stop layer until the initial stop layer is exposed is completed using a dry etch.

45. The method of claim 35 wherein planarizing the isolation layer is completed using a chemical mechanical polish.

46. The method of claim 35 wherein forming a plurality of interconnects over portions of the plurality of regions of the final stop layer comprises:

depositing a layer of interconnect metal which overlies the plurality of regions of the final stop layer; and
selectively etching the layer of interconnect metal to interconnect each one of the plurality of magnetoresistive memory storage bit to another one of the plurality of magnetoresistive memory storage bits.

47. The method of claim 46 wherein depositing a layer of interconnect metal comprises depositing a layer consisting of titanium and tungsten.

48. The method of claim 35 wherein forming the read and write control circuitry on the semiconductor substrate comprises using a complementary metal-oxide semiconductor process.

49. The method of claim 35 wherein providing a semiconductor substrate further comprises forming an initial layer of metal overlying the semiconductor substrate, the initial dielectric layer overlying the initial layer of metal.

50. The method of claim 35 wherein forming the initial stop layer comprises forming a layer having an etch selectivity which is greater than the etch selectivity of the hardmask layer.

51. The method of claim 50 wherein forming the initial stop layer comprise forming a layer having an etch selectivity which is 25 times greater than the etch selectivity of the hardmask layer.

52. The method of claim 35 wherein forming the isolation layer comprises:

forming a barrier layer extending over the hardmask layer and into the plurality of etch regions to conformally overlie the hardmask layer and the exposed portions of the final stop layer, the initial stop layer, the magnetoresistive storage layer and the initial dielectric layer an the plurality of etch regions; and
forming a final dielectric layer over the barrier layer wherein the final dielectric layer has sufficient thickness to fill in the gaps created by etching the plurality of etch regions.

53. The method of claim 52 wherein forming the barrier layer comprises forming a layer consisting of silicon nitride.

54. A method of manufacturing an interconnect for a magnetoresistive memory on a semiconductor substrate comprising:

(a) forming an initial dielectric layer overlying the semiconductor substrate;
(b) planarizing the initial dielectric layer;
(c) forming a magnetoresistive storage layer overlying the initial dielectric layer;
(d) foaming an electrically-conductive stop layer overlying the magnetoresistive storage layer;
(e) forming a hardmask layer overlying the stop layer;
(f) etching the hardmask layer until the stop layer is exposed to define an etch region;
(g) etching through the stop layer and the magnetoresistive storage layer until the initial dielectric layer is exposed using the etch region as an etch opening;
(h) forming an isolation layer extending over the hardmask layer and into the etch region, the isolation layer having sufficient thickness to fill in the gaps created by etching the etch region;
(i) planarizing the isolation layer until regions of the stop layer are exposed; and
(j) forming an interconnect layer over the exposed regions of the stop layer.

55. The method of claim 54, further comprising:

forming a second electrically-conductive stop layer over the stop layer wherein the second electronically-conductive stop layer has both an etch selectively and a chemical mechanical polish stop selectively greater than that of the hardmask layer; and wherein etching through the hardmask layer includes etching through the second stop layer.

56. A method of manufacturing an interconnect for a magnetoresistive memory on a semiconductor substrate comprising:

(a) forming an initial dielectric layer overlying the semiconductor substrate;

(b) planarizing the initial dielectric layer;

(c) forming a magnetoresistive storage layer overlying the initial dielectric layer;

(d) forming an electrically conductive stop layer overlying the magnetoresistive storage layer;

(e) forming a hardmask layer overlying the stop layer, the hardmask layer having an etch selectivity less than the etch selectivity of the stop layer;

(f) etching the hardmask layer until the stop layer is exposed to define an etch region;

(g) etching through the stop layer and the magnetoresistive storage layer using blanket ion milling until the initial dielectric layer is exposed using the etch region as an etch opening;

(h) forming an isolation layer extending over the hardmask layer and into the etch region, the isolation layer having sufficient thickness to fill in the gaps created by etching (i) planarizing the isolation layer using chemical mechanical polishing until regions of the stop layer are exposed; and (j) forming an interconnect layer over the exposed regions of the stop layer.

57. The method of claim 56, further comprising:

forming a second electrically conductive stop layer over the stop layer wherein the second electrically-conductive stop layer has both an etch selectively and a chemical mechanical polish stop selectively greater than that of the hardmask layer; and wherein etching through the hardmask layer includes etching through the second stop layer.

58. The method of claim 57 wherein forming the second stop layer comprises forming a layer which has a chemical mechanical polish stop selectivity which is greater than the hardmask layer.

* * * * *